(12) United States Patent
Yu et al.

(10) Patent No.: US 10,401,635 B2
(45) Date of Patent: Sep. 3, 2019

(54) LASER ARRAY BEAM COMBINER

(71) Applicant: WENZHOU FIBRE LASER CO., LTD., Wenzhou (CN)

(72) Inventors: Steven Qinyue Yu, Laguna Hills, CA (US); JingFu Hu, Burnaby (CA)

(73) Assignee: WENZHOU FIBRE LASER CO., LTD., Wenzhou (CN)

( * ) Notice: Subject to any disclaimer, the term of this patent is extended or adjusted under 35 U.S.C. 154(b) by 0 days.

(21) Appl. No.: 15/823,553

(22) Filed: Nov. 27, 2017

(65) Prior Publication Data

US 2018/0081184 A1 Mar. 22, 2018

Related U.S. Application Data

(63) Continuation of application No. PCT/CN2015/080106, filed on May 28, 2015.

(51) Int. Cl.
| | |
|---|---|
| *G02B 27/14* | (2006.01) |
| *G02B 27/10* | (2006.01) |
| *G02B 27/30* | (2006.01) |
| *H01S 5/10* | (2006.01) |
| *H01S 5/14* | (2006.01) |
| *H01S 5/40* | (2006.01) |
| *G02B 19/00* | (2006.01) |

(52) U.S. Cl.
CPC ..... *G02B 27/1086* (2013.01); *G02B 19/0057* (2013.01); *G02B 27/1006* (2013.01); *G02B 27/143* (2013.01); *G02B 27/30* (2013.01); *H01S 5/1039* (2013.01); *H01S 5/143* (2013.01); *H01S 5/405* (2013.01); *H01S 5/4012* (2013.01); *H01S 5/4062* (2013.01); *H01S 5/4087* (2013.01)

(58) Field of Classification Search
CPC ............ G02B 27/1086; G02B 27/0922; G02B 27/1006; G02B 27/143; G02B 27/30; H01S 5/1039; H01S 5/143; H01S 5/4012; H01S 5/405; H01S 5/4062; H01S 5/4087
USPC .......................................... 359/629, 641, 710
See application file for complete search history.

(56) References Cited

U.S. PATENT DOCUMENTS

2008/0019010 A1 1/2008 Govorkov et al.

FOREIGN PATENT DOCUMENTS

| CN | 201368940 Y | 12/2009 |
|---|---|---|
| CN | 103944069 A | 7/2014 |
| CN | 104300368 A * | 1/2015 |

(Continued)

*Primary Examiner* — William Choi
(74) *Attorney, Agent, or Firm* — Hemisphere Law, PLLC; Zhigang Ma (57) ABSTRACT

Disclosed is a laser array beam combiner. A laser array emits a laser beam bundle that is incident on and transmits through a fast-axis collimator to form a one-dimensional quasi-parallel beam bundle A. The first quasi-parallel beam bundle is then incident on and transmits through the cylindrical lens to form a two-dimensional quasi-parallel beam bundle B. The quasi-parallel beam bundle B is then incident on and transmits through the dispersion unit and returns along the original path to the cylindrical lens, and then transmits through the cylindrical lens to be focused onto a common image point. Thus, the wavelengths of various light emitting spots of the laser array can be locked and the individual array beams can be automatically synthesized as a single-point beam bundle, improving the brightness of the laser array.

14 Claims, 5 Drawing Sheets

(56) References Cited

FOREIGN PATENT DOCUMENTS

| CN | 104300368 A | 1/2015 |
| CN | 104901162 A | 9/2015 |
| JP | 2006349784 A | 12/2006 |

* cited by examiner

LASER ARRAY BEAM COMBINER

TECHNICAL FIELD

This disclosure relates generally to laser diode array beam shaping and coupling, and more particularly, relates to a laser array beam combiner.

BACKGROUND

Diode laser arrays have a most prominent advantage of high electrical-to-optical efficiency and so are very suitable for use in industrial processing. But their defect is poor beam quality which affects their range of industrial applications.

Prior techniques for improving the beam quality generally fall into two categories, coherent superposition and non-coherent superposition. Coherent superposition is essentially the superposition of the amplitudes of the light waves. While it can effectively improve the output beam quality of the semiconductor arrays, coherent superposition requires the phases of the various superposed sub-light-sources be synchronously locked, which entails high technical difficulty, making it hard to obtain high-power in-phase stable output. Non-coherent superposition is the superposition of luminous intensities, including methods such as beam shaping, superposition of polarizations, or superposition of wavelengths. Existing luminous intensity superposition techniques, however, are difficult to obtain ultra-high brightness beams, and the beam quality improvement is limited. Most of these techniques are passive ones which can only passively improve the total beam quality through beam shaping under existing array parameters.

SUMMARY

In view of this, there is a need to provide a laser array beam combiner which can improve the brightness of the laser array beam by locking the wavelengths of various light emitting spots of the laser array and enabling the individual array beams to be automatically synthesized as a single-point beam bundle.

The following technical solution can be adopted for the above objective.

A laser array beam combiner may include a laser array unit, a cylindrical lens, and a dispersion unit disposed sequentially along a beam transmission direction, where the laser array unit may include at least one laser array and a fast-axis collimator disposed corresponding to each of the at least one laser array.

The laser array may emit a bundle of laser beams that may be incident on and transmit through the fast-axis collimator to form a one-dimensional quasi-parallel beam bundle A. The quasi-parallel beam bundle A may then be incident on and transmit through the cylindrical lens to form a two-dimensional quasi-parallel beam bundle B. Then the quasi-parallel beam bundle B may be incident on and transmit through the dispersion unit to return to the cylindrical lens along the original path and then be focused by the cylindrical lens to form a common image point.

In some embodiments, the laser array may be a semiconductor laser array or fiber laser array having gain characteristics.

In some embodiments, the laser array unit may include a first laser array, a second laser array, a first fast-axis collimator disposed corresponding to the first laser array, a second fast-axis collimator disposed corresponding to the second laser array, and a bar-shaped beam combiner. The bar-shaped beam combiner may include alternating spaced lenses and mirrors. The first laser array may emit a beam bundle that transmits through the first fast-axis collimator to form a first quasi-parallel beam bundle, which may then transmit through the lenses. The second laser array may emit a beam bundle that transmits through the second fast-axis collimator to from a second quasi-parallel beam bundle, which may then be reflected by the mirrors. As such, the beam bundle that transmits through the lenses together with the beam bundle reflected by the mirrors may eventually create a combined beam bundle that may then be incident on the cylindrical lens.

In some embodiments, the first laser array and the second laser array may be placed perpendicular to each other.

In some embodiments, the cylindrical lens and the laser array may be separated by a distance of a focal length of the cylindrical lens.

In some embodiments, the dispersion unit may be a total-internal-reflection-type phase grating.

In some embodiments, the total-internal-reflection-type phase grating may include a body and a grating formed on the body, the body being of a fused quartz material.

In some embodiments, the body may be shaped as a rectangle, a right triangle, an oblique triangle, or a sphere.

In some embodiments, an angle of the oblique triangle may be the Brewster angle.

In some embodiments, the laser array beam combiner may further include a selective reflection unit disposed in a plane in which the common image point lies. The beam bundle focused by the cylindrical lens may sequentially pass through the selective reflection unit, the cylindrical lens, the dispersion unit, the cylindrical lens, and the fast-axis collimator to return to the laser array.

In some embodiments, the selective reflection unit may be a cylindrical lens or a stripe-shaped reflector, where the stripe-shaped reflector may include a transmissive glass lens and a partial reflective film plated on a partial area of the glass lens.

The above-described technical solution in accordance with this disclosure may bring the following technical effects.

In one aspect, with the laser array beam combiner provided by the disclosure, a laser beam bundle emitted by the laser array may be incident on and transmit through the fast-axis collimator to form a one-dimensional quasi-parallel beam bundle A. This first quasi-parallel beam bundle may then be incident on and transmit through the cylindrical lens to form a two-dimensional quasi-parallel beam bundle B. Then the quasi-parallel beam bundle B may be incident on and transmit through the dispersion unit to return to the cylindrical lens along the original path and then be focused by the cylindrical lens to form a common image point. Thus, the wavelengths of various light emitting spots of the laser array can be locked and the individual array beams can be automatically synthesized as a single-point beam so that the brightness of the laser array beam bundle can be improved.

In another aspect, the laser array beam combiner provided by this disclosure may further include a selective reflection unit, so that the beam bundle focused by the cylindrical lens may sequentially pass through the selective reflection unit, the cylindrical lens, the dispersion unit, the cylindrical lens, and the fast-axis collimator to return to the laser array. As such, the beam bundle returned to the laser array will be amplified enabling the function of the laser array as a laser oscillation feedback cavity. Also, the beam bundle re-emitted by the laser array would again transmit to the selective reflection unit and then return to the laser array, so that the selective reflection member functions as an external cavity coupling output mirror and that different spatial object points that pass through the external cavity containing dispersion image would have the same common image point, which can further improve the brightness of the laser array.

DETAILED DESCRIPTION OF ILLUSTRATED EMBODIMENTS

Hereinafter the present disclosure will be more fully described with reference to the accompanying drawings to provide a better understanding of the disclosure. Some exemplary embodiments have been given in the accompanying drawings. However, this disclosure can be practiced in various different forms and won't be limited to the embodiments described herein. Rather, the purpose of providing these embodiments is to enable a comprehensive understanding of the disclosure.

As used herein, the terms "first," "second," are merely illustrative of the disclosure and are not intended to limit the disclosure. As used herein, the terms "rectangular-shaped," "right-triangular-shaped," "oblique-triangular-shaped," and "spherical-shaped," merely represent specific implementations, and the disclosure won't be limited to the particular implementations mentioned. As used herein, the terms "perpendicular," "horizontal," "left," "right," and similar expressions are for purposes of illustration only and are not meant to be the only implementations.

Unless otherwise defined, all technical and scientific terms used herein will have the same meanings as commonly understood by those skilled in the art to which the disclosure pertains. The terminology used in the specification of the disclosure is for the purpose of describing particular embodiments only and is not intended to limit the disclosure. The term "and/or," compasses any and all combinations of one or more of the associated listed items.

Figure 1:
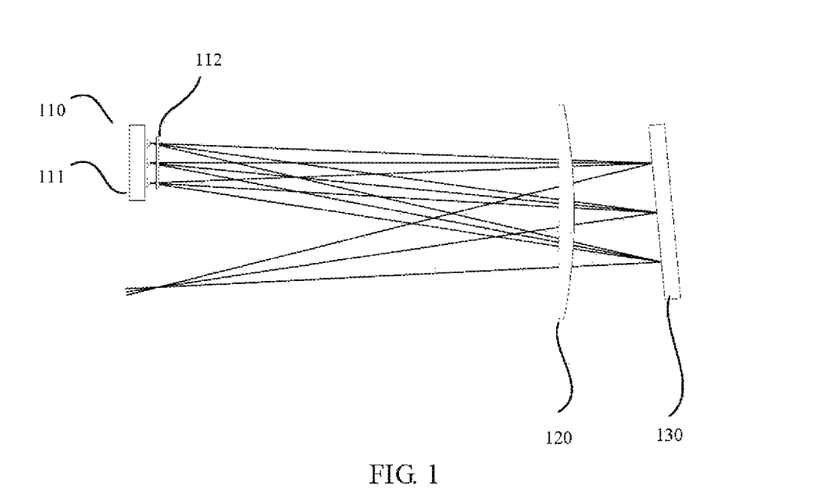
FIG. 1 is a schematic diagram of a laser array beam combiner in accordance with a first embodiment of the disclosure.

As illustrated in FIG. 1, a laser array beam combiner 100 provided by a first embodiment of the disclosure may include a laser array unit 110, a cylindrical lens 120, and a dispersion unit 130 that are sequentially disposed along a beam transmission direction. The laser array unit 110 may include at least one laser array 111 and a fast-axis collimator 112 disposed corresponding to each of the at least one laser array unit 111. The laser array 110 may be a semiconductor laser array or a fiber laser array having gain characteristics. The cylindrical lens 120 and the laser array 111 may be separated by a distance of a focal length of the cylindrical lens 120.

The above-described laser array beam combiner 100 may operate in such a manner that a bundle of laser beams emitted from the laser array 111 may be incident on and transmit through the fast-axis collimator 112 to form a quasi-parallel beam bundle A. The quasi-parallel beam A may then be incident on and transmit through the cylindrical lens to form a quasi-parallel beam bundle B. Then the quasi-parallel beam bundle B may be incident on and transmit through the dispersion unit 130 to return to the cylindrical lens 120 along the original path and then be focused by the cylindrical lens 120 to form a common image point.

It will be appreciated that since the laser array 111 is a plurality of independent light emitting bodies assumed to have different wavelengths, these light emitting bodies, after passing through the cylindrical lens 120, may become multiple quasi-parallel beam bundles of different directions, and these quasi-parallel beam bundles may then enter the dispersion unit 130 to be diffracted. The diffracted beams may return substantially along the original path and again be incident on the cylindrical lens 120. Different wavelengths may result in different angles of diffraction after passing through the dispersion unit 130, but there will always be a case in which the above-described multiple incident beams of different wavelengths fall on the dispersion unit 130 at different angles to result in their respective diffracted beams being emergent at the same angle and then being focused onto one same point, called the common image point. As such, the wavelengths of various light emitting spots of the laser array can be locked and the individual array beams can be automatically synthesized as a single-point beam bundle, and so the brightness of the laser array beam bundle can be improved.

Figure 2:
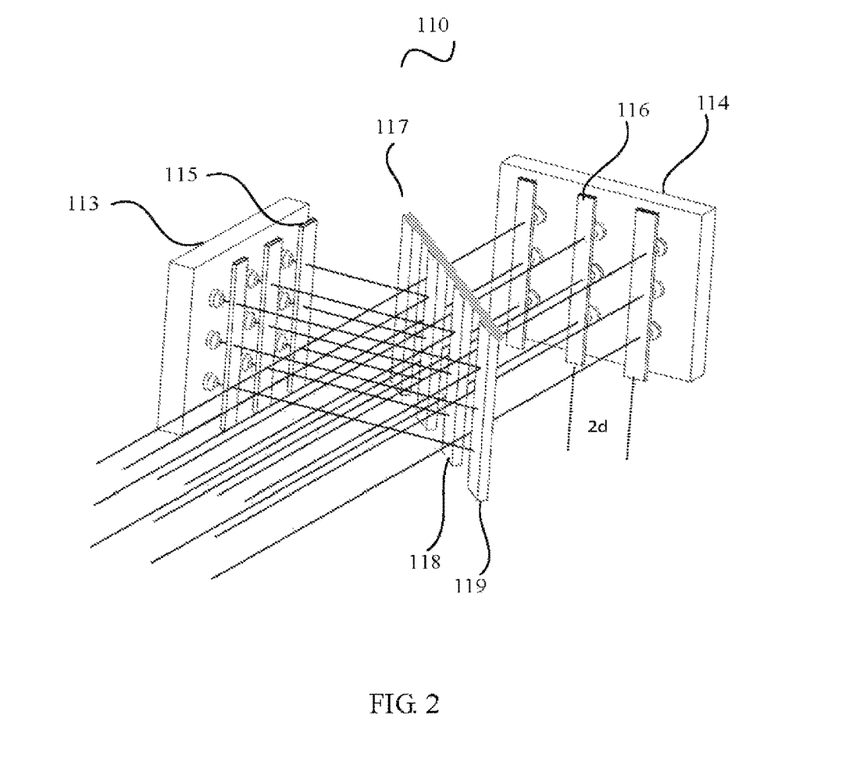
FIG. 2 is a schematic diagram of a laser array unit in accordance with an exemplary implementation of the first embodiment of the disclosure.

FIG. 2 shows a schematic diagram of a laser array unit 100 in accordance with an exemplary implementation of the first embodiment of the disclosure. The laser array unit 100 may include a first laser array 113, a second laser array 114, a fast-axis collimator 115 disposed corresponding to the first laser array 113, a second fast-axis collimator 116 disposed corresponding to the second laser array 114, and a bar-shaped beam combiner 117 that, includes alternating spaced lenses 118 and mirrors 119.

The laser array unit 100 may operate in such a manner that the first laser array 113 may emit a laser beam bundle that passes through the fast-axis collimator 115 to form a first quasi-parallel beam bundle, which may then transmit through the lenses 118. The second laser array 114 may emit laser beams that pass through the second fast-axis collimator 116 to form a second quasi-parallel beam bundle, which may then be reflected by the mirrors 119. Thus, the beams transmitting through the lenses 118 and the beams reflected by the minors 119 would form a combined beam bundle which may then be incident on the cylindrical lens 120.

It will be appreciated that the first laser array 113 and the second laser array 114 may be two two-dimensional light emitting arrays consisting of two separate arrays respectively, and in front of each array may be provided an independent fast-axis collimator such as the first fast-axis collimator 115 or the second fast-axis collimator 116, with a spacing of each array being 2d. The bar-shaped beam combiner 117 may include alternating spaced lenses 118 and mirrors 119, where the lenses 118 are used for increasing the transmittance of the incident beams while the adjacent mirrors 119 are total reflection mirrors. The first laser array 113 and the second laser array 114 may be placed perpendicular to each other, and the bar-shaped beam combiner 117 may, in the fast-axis direction, spatially combine the six beam arrays emitted by the first and second laser arrays 114, with the spacing between two adjacent beam arrays after the combination becoming d. Therefore, the beam density in the fast axis direction can be effectively increased and so an output combined laser beam bundle with an even higher brightness can be obtained through the combination.

The dispersion unit 130 may be a total-internal-reflection-type phase grating. The total-internal-reflection-type phase grating may include a body and a grating formed on the body, the body being of a fused quartz material. The body may be rectangular-shaped, or right-triangular-shaped, or oblique-triangular-shaped or spherical-shaped. It will be appreciated that by directly fabricating a grating on the body material, it is possible to obtain an efficient grating with a high damage threshold. For example, a grating can be fabricated directly on the fused quartz material, so that for specific wavelengths under the total-internal-reflection and autocollimation conditions, the −1 order diffracted light can amount to up to 99% while the zero order diffraction may be less than 1%. The material of the total-internal-reflection grating discussed herein, however, won't be limited to fused quartz, and other optical materials or crystalline materials may also be used to fabricate such gratings.

Figure 3:
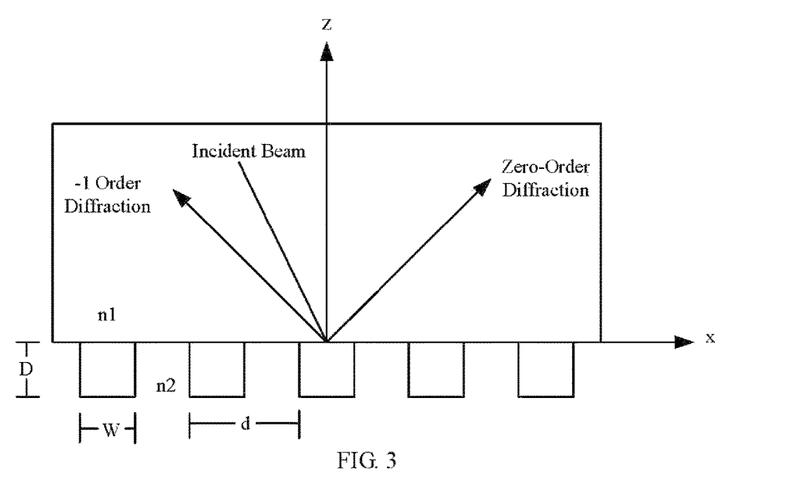
FIG. 3 is a schematic diagram of a total-internal-reflection-type phase grating when the body is rectangular-shaped.

FIG. 3 shows a schematic diagram of a total-internal-reflection-type phase grating 131 when the body is shaped as a rectangle. As can be seen from FIG. 3, the refractive index of the air is denoted by n2, the rectangular-shaped grating has a groove depth of D and a groove width of w, and the grating constant is d. When light is incident from the quartz material onto the grating at the autocollimation angle and the grating period satisfies a certain condition, then the incident light may all be reflected back into the quartz prism and diffracted in the direction opposite to the direction of incidence, with −1 order diffraction efficiency of up to 99% and zero order diffracted light usually less than 1%. By using the total-internal-reflection grating produced on this principle as the internal cavity dispersion unit, it is possible to obtain a beam combining efficiency of greater than 90%.

Figure 4:
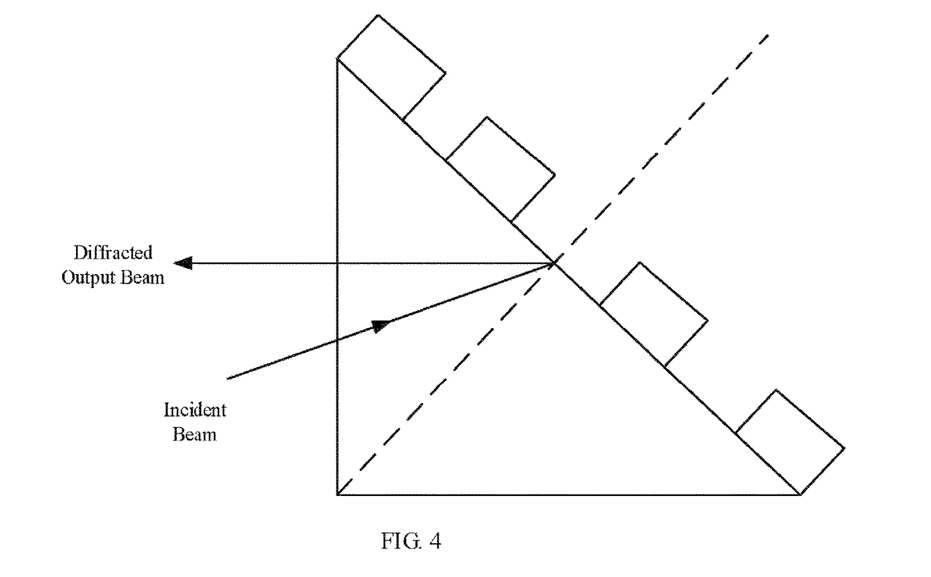
FIG. 4 is a schematic diagram of a total-internal-reflection-type phase grating when the body is right-triangular-shaped.

FIG. 4 shows a schematic diagram of a total-internal-reflection-type phase grating 132 when the body is shaped as a right triangle. As can be seen from FIG. 4, the beam is incident on a right-angled surface and transmits into the quartz at an angle of incidence of nearly zero degrees, and inside the quartz the angle of incidence on the grating disposed on the surface at the opposite sloping side is about 45 degrees. As such, the grating period, the duty cycle, and the groove depth can be designed so as to satisfy the collimation conditions, so that the −1 order diffracted light would return along the path of the incident light and then be emergent from the right-angled surface where the incidence happened. While an angle of deviation may exist between the orientation perpendicular to the direction of diffraction and the incident light beam, the diffraction efficiency would almost be the same as the ideal efficiency when the light is returned along the original path.

Figure 5:
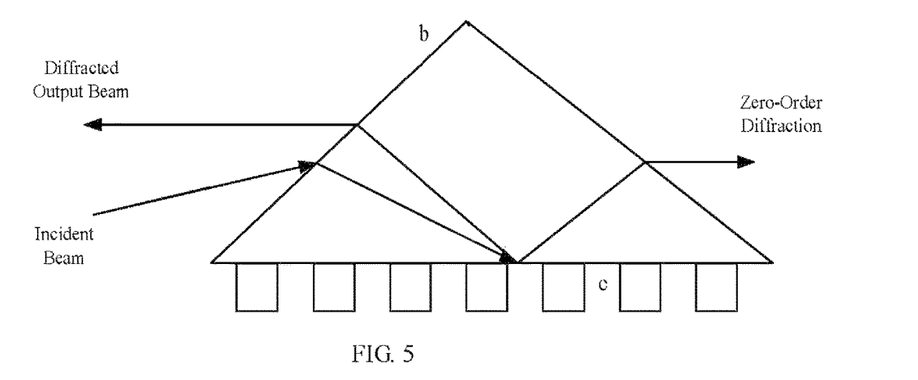
FIG. 5 is a schematic diagram of a total-internal-reflection-type phase grating when the body is oblique-triangular-shaped.

FIG. 5 shows a schematic diagram of a total-internal-reflection-type phase grating 133 when the body is shaped as an oblique triangle. As can been from FIG. 5, the angle of the total-internal-reflection grating fabricated by an oblique-angled prism can be designed to the Brewster angle, so that when the incident light falls on the air and quartz interface, the process of plating the anti-reflection film can be saved for the polarized light perpendicular to the plane of incidence, and the zero order diffracted light would be emergent from another surface, improving the system stability for high-power beam combining. In particular, the above-described prism can also be cut along the line through points b and c to keep the right-angled prism in the front for use, by which the same effects can be achieved.

Figure 6:
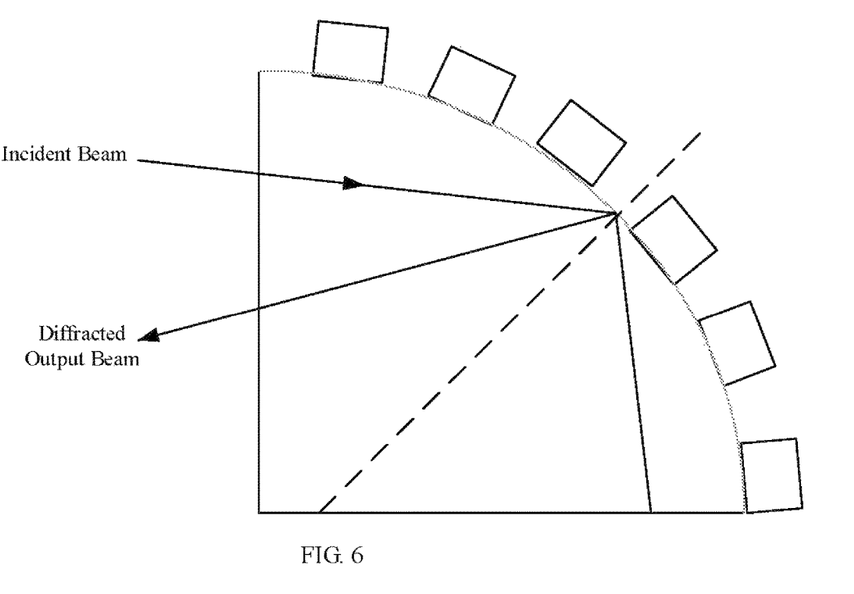
FIG. 6 is a schematic diagram of a total-internal-reflection-type phase grating when the body is spherical-shaped.

FIG. 6 shows a schematic diagram of a total-internal-reflection-type phase grating 134 when the body is shaped as a sphere. As can be seen from FIG. 6, if the grating surface of the quartz material has a certain curvature, then in the configuration according to this disclosure the cylindrical lens disposed in front of the total-internal-reflection-type phase grating can be replaced by the grating surface in function. Thus, such a single spherical-shaped total-internal-reflection grating plus the selective reflection member and the emitting arrays having gains will be able to constitute the above-described beam combiner.

An advantage of the above-mentioned gratings of various specific structures is that the grating density can be as high as 2200 lines/mm, so that if the 980 nm laser beam doesn't satisfy the conditions imposed by the grating equation, the grating does not contain a multi-layer dielectric film, and has an extremely high damage threshold which is equivalent to the damage threshold of the material itself.

Figure 7:
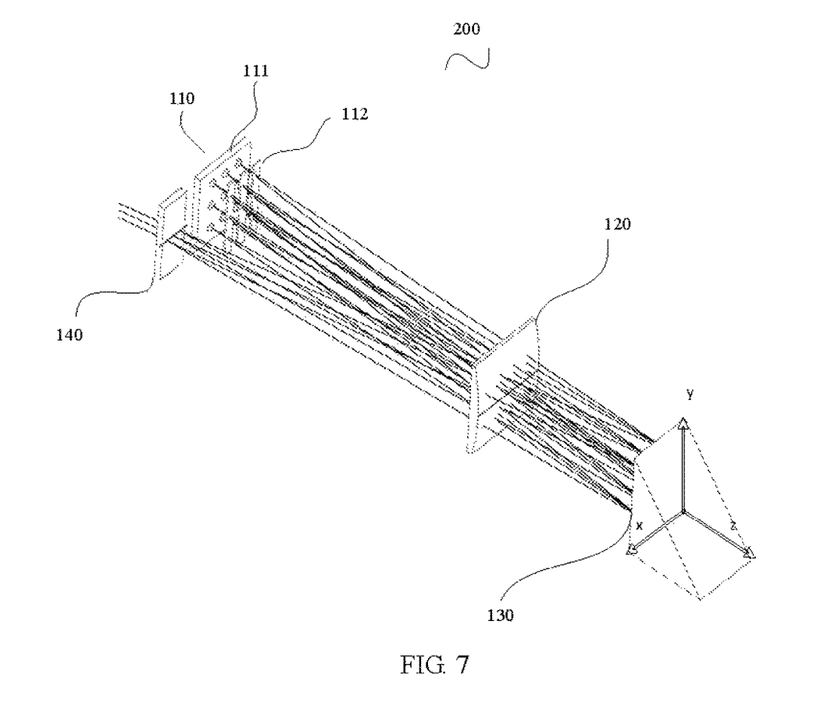
FIG. 7 is a schematic diagram of a laser array beam combiner in accordance with a second embodiment of the disclosure.

FIG. 7 illustrates a laser array beam combiner 200 provided by a second embodiment of the disclosure, which differs from the first embodiment in that it further includes a selective reflection unit 140 disposed in the plane in which the common image point lies. The beam bundle focused by the cylindrical lens 120 may sequentially pass through the selective reflection unit 140, the cylindrical lens 120, the dispersion unit 130, the cylindrical lens 120, the fast-axis collimator 112, and eventually return to the laser array 111.

Typically, the selective reflection unit 140 may be a cylindrical lens or a stripe-shaped reflector. When it is a stripe-shaped reflector, the selective reflection unit 140 would be a glass lens for transmitting light beams in most area, while at its middle part may be plated a very narrow reflective film, the width of which can lie in the range of 20 um to 200 um and the reflectance can range from 4% to 80%. The function of the selective reflection unit 140 is to selectively feed a small part of the light in the overlapping image area back to different light emitting spots, achieving the purpose of selecting laser beam wavelengths. Two reflectance distribution modes of the stripe-shaped reflector have been given in FIG. 8, while in practice the reflectance distribution can take various curve forms. When the selective reflection unit 140 is a cylindrical lens, it can also feed a part of the light of the image area of the plane in which the common image point lies back to the light emitting spots. The cylindrical lens can also be plated with a stripe-shaped reflection part to enhance the locking effect and thus further improve the beam combining rate—in practice, the stripe-shaped reflector with the appropriate curvature and reflectance can be selected to obtain the optimum output power. In particular, the cylindrical lens may adopt a convex surface as a selective reflecting surface, which can achieve the same effects as those of the beam combining by a concave surface.

Figure 8:
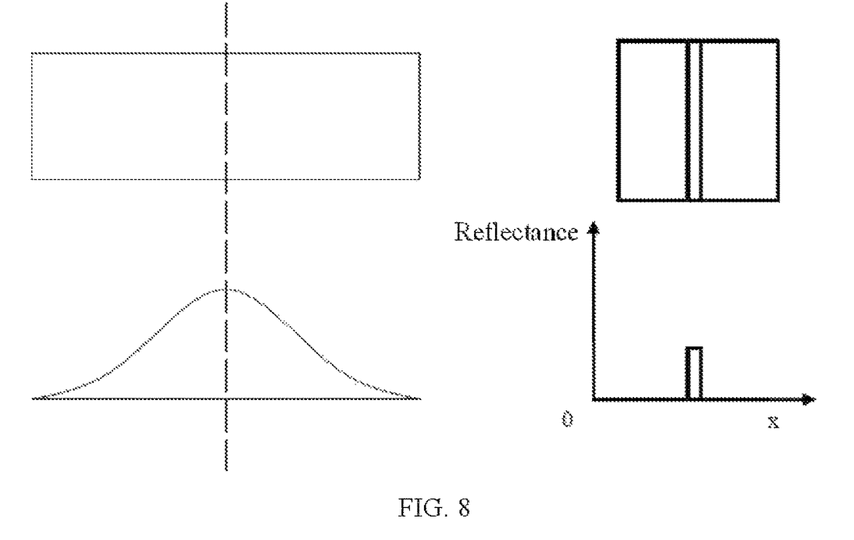
FIG. 8 is a schematic representation illustrating two reflectance distribution modes of a stripe-shaped reflector in accordance with an embodiment of the disclosure.

The above-described reflective film can be so selected that it can have a variety of distributions across a very narrow area, or can also be plated as a narrower two-line reflection mode. For example, two 15 um reflective stripes can be plated with a transmissive spacing of 20 um, which can also obtain a single-point laser output with a high beam-combining rate.

Figure 9:
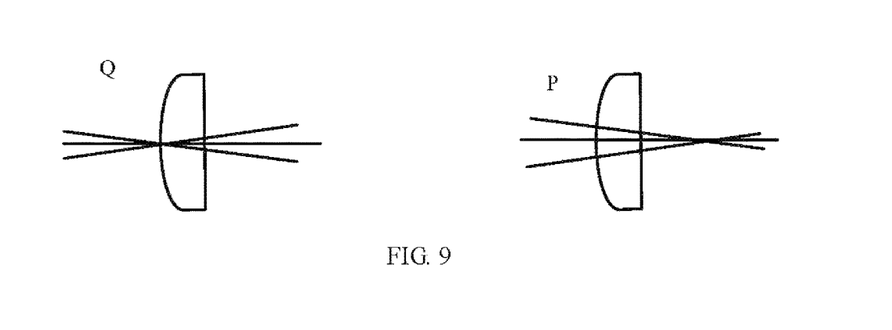
FIG. 9 is a schematic diagram illustrating two cases of the position of the common image point when the cylindrical lens is used as the selective reflection unit.

As can be seen from FIG. 9, the beam bundle emitted by the laser array 111 may pass through the corresponding fast-axis collimator 112 to become beams that are quasi-parallel along the x direction, where the slow axis direction of the beam array is along the y-axis, and the slow-axis direction array as illustrated in the figure includes three light emitting units. Then the beam bundle may pass through the cylindrical lens 120, and the respective beam array light emitting units may be converted into three groups of quasi-parallel beams of different directions which may then be incident on a right-angled surface of the total-internal-reflection grating, where the direction of diffraction in the grating is along the y axis, while the z axis is the direction of an incident beam, and the diffracted beam is emergent along the −z axis, but the diffracted beam will deviate from the original incident beam path by a slight angle across the x axis. The diffracted beam may propagate a certain distance to reach the selective reflection unit 140, and after passing through the selective reflection unit 140, the light of the beam bundle in a certain area along the y axis may be reflected by the selective reflection unit 140 back to their respective light emitting spots at a small angle in the direction opposite to the incident direction, and thus form an external cavity laser device. The laser mode through the laser amplification and oscillation may pass through the above-described external cavity and form respective common image points of the light emitting spots in the selective reflection area of the selective reflection unit 140. But the respective longitudinal mode wavelengths are slightly different, the output terminal of the selective reflection unit 140 has the image point output beam bundle of only one light source in the beam array's y direction, but participating in the imaging is the sum of the luminous power of various light emitting spots. By selecting the appropriate reflectance, only the modes among the various light emitting units that satisfy the common image point in the gain bandwidth will exist, while the other modes cannot oscillate, so that the beam array multi-point output beam bundle can be converted to a single-point output beam bundle. Along the x direction, three arrays becomes three-point spatial side-by-side combined beam bundle output. It will be appreciated that in the actual cavity generation process, the position of the selective reflection unit 140 can meet the conditions of the common imaging within a certain range near the plane in the common image point lies, but a slight position change may have a certain influence on the size of the common imaging point.

In particular, if the selective reflection unit 140 uses the cylindrical lens for selective reflection, then the common image point of the selective reflection may be on the cylinder surface or may be adjusted to the spherical center of the cylindrical surface. FIG. 8 illustrated two cases of the position of the common image point when the cylindrical lens is used as the selective reflection unit, where the points Q and P are imaged, with the image of the point P typically smaller than that of Q.

It will be appreciated that since the wavelengths of the object light emitting points of the respective laser arrays of the laser array unit 110 generally do not satisfy the above set conditions plus the light emitted by the object light emitting points of the respective laser arrays may have a certain spectral width, the plane in which the common image point lies will show intermittent or continuous line segments, depending on the objects points' emission spectral width, with a point on the line segments representing a particular laser beam wavelength. When the emission spectral width exceeds a certain value, the various image points may overlap, with the beams of the overlapping part coming from different light emitting spots and having different wavelengths. In this case, if a selective reflective optical component is placed in the overlapping imaging area in the plane in which the common image point lies, then a part of beams of the overlapping part may be selected to return along the original path to their respective light emitting object points as the feedback cavity of laser oscillation. Thus, this part of returned light will be amplified while other parts of light won't be fed back and amplified and so may gradually reduce and disappear. Then, the beams emitted again will automatically arrive at the selective reflective member and return to the object light emitting units, where the selective reflective member plays the role of an external cavity coupling output mirror, essentially automatically achieving the purpose that different spatial object points can have the same common image point through the dispersion imaging cavity. It is particularly pointed out that the beam parameter product of the common image point may be the same as the beam parameter products of the object individual light emitting points, and under certain conditions can be less than the beam parameter product of the object point when there is no feedback. From the vantage point of the external cavity coupling output mirror, the laser power is the number of light emitting points multiplied by the power of a single object light emitting point, so that the total beam parameter product is the same as that of a single light emitting object point, which essentially improves the brightness of the laser array.

The foregoing embodiments are not to be construed as limiting the scope of the disclosure. Any modifications, equivalent substitutions, and improvements made without departing from the spirit and principle of the disclosure are intended to be all compassed within the scope of the appended claims.

What is claimed is:

1. A laser array beam combiner comprising a laser array unit, a cylindrical lens, and a dispersion unit sequentially disposed along a beam transmission direction, the laser array unit comprising at least one laser array and a fast-axis collimator disposed corresponding to each of the at least one laser array, wherein the laser array emits a laser beam bundle that is incident on and transmits through the fast-axis collimator to form an one-dimensional quasi-parallel beam bundle A, and the quasi-parallel beam bundle A is incident on and transmits through the cylindrical lens to form a two-dimensional quasi-parallel beam bundle B, and the quasi-parallel beam bundle B enters the dispersion unit to be diffracted, and the diffracted beam bundle returns to the cylindrical lens and transmits through the cylindrical lens to be focused onto a common image point, wherein the laser array unit comprises a first laser array, a second laser array, a first fast-axis collimator disposed corresponding to the first laser array, a second fast-axis collimator disposed corresponding to the second laser array, and a bar-shaped beam combiner that comprises alternating spaced lenses and mirrors; wherein the first laser array emits a laser beam bundle that passes through the first fast-axis collimator to form a first quasi-parallel beam bundle which transmits through the lenses, and the second laser array emits a laser beam bundle that passes through the second fast-axis collimator to form a second quasi-parallel beam bundle, which is reflected by the mirrors; the beam bundle transmitting through the lenses and the beam bundle reflected by the mirrors form a combined beam bundle which is incident on the cylindrical lens.

2. The laser array beam combiner of claim 1, wherein the at least one laser array comprises a semiconductor laser array or a fiber laser array having gain characteristics.

3. The laser array beam combiner of claim 1, wherein the first laser array and the second laser array are placed perpendicular to each other.

4. A laser array beam combiner comprising a laser array unit, a cylindrical lens, and a dispersion unit sequentially disposed along a beam transmission direction, the laser array unit comprising at least one laser array and a fast-axis collimator disposed corresponding to each of the at least one laser array, wherein the laser array emits a laser beam bundle that is incident on and transmits through the fast-axis collimator to form an one-dimensional quasi-parallel beam bundle A, and the quasi-parallel beam bundle A is incident on and transmits through the cylindrical lens to form a two-dimensional quasi-parallel beam bundle B, and the quasi-parallel beam bundle B enters the dispersion unit to be diffracted, the diffracted beam bundle returns to the cylindrical lens and transmits through the cylindrical lens to be focused onto a common image point, wherein the dispersion unit is a total-internal-reflection-type phase grating.

5. The laser array beam combiner of claim 4, wherein the total-internal-reflection-type phase grating comprises a body and a grating formed on the body, the body being a fused quartz material.

6. The laser array beam combiner of claim 5, wherein the body is shaped as a rectangle, a right triangle, an oblique triangle, or a sphere.

7. The laser array beam combiner of claim 6, wherein an angle of the oblique triangle is Brewster angle.

8. The laser array beam combiner of claim 4, wherein the cylindrical lens and the laser array are separated by a distance of a focal length of the cylindrical lens.

9. A laser array beam combiner comprising a laser array unit, a cylindrical lens, and a dispersion unit sequentially disposed along a beam transmission direction, the laser array unit comprising at least one laser array and a fast-axis collimator disposed corresponding to each of the at least one laser array, wherein the laser array emits a laser beam bundle that is incident on and transmits through the fast-axis collimator to form an one-dimensional quasi-parallel beam bundle A, and the quasi-parallel beam bundle A is incident on and transmits through the cylindrical lens to form a two-dimensional quasi-parallel beam bundle B, and the quasi-parallel beam bundle B enters the dispersion unit to be diffracted, the diffracted beam bundle returns to the cylindrical lens and transmits through the cylindrical lens to be focused onto a common image point, wherein the laser array beam combiner further comprises a selective reflection unit disposed in a plane in which the common image point lies, wherein a part of the diffracted beam bundle focused by the cylindrical lens is reflected by the selective reflection unit and sequentially passes through the cylindrical lens, the dispersion unit, the cylindrical lens, and the fast-axis collimator to return to the laser array, wherein the selective reflection unit is a cylindrical lens.

10. The laser array beam combiner of claim 9, wherein a width of the reflective film is in the range of 20 um to 200 um.

11. The laser array beam combiner of claim 9, wherein the cylindrical lens and the laser array are separated by a distance of a focal length of the cylindrical lens.

12. The laser array beam combiner of claim 9, wherein the dispersion unit is a total-internal-reflection-type phase grating.

13. The laser array beam combiner of claim 12, wherein the total-internal-reflection-type phase grating comprises a body and a grating formed on the body, the body being a fused quartz material.

14. The laser array beam combiner of claim 13, wherein the body is shaped as a rectangle, a right triangle, an oblique triangle, or a sphere.

* * * * *